United States Patent [19]

Toyoshima et al.

[11] Patent Number: 5,153,146
[45] Date of Patent: Oct. 6, 1992

[54] MAUFACTURING METHOD OF SEMICONDUCTOR DEVICES

[75] Inventors: Yoshiaki Toyoshima, Matsudo; Tamao Eguchi, Tokyo, both of Japan

[73] Assignee: Kabushiki Kaisha Toshiba, Kawasaki, Japan

[21] Appl. No.: 705,570

[22] Filed: May 24, 1991

[30] Foreign Application Priority Data

May 28, 1990 [JP] Japan .................................. 2-137333
Nov. 6, 1990 [JP] Japan .................................. 2-300184

[51] Int. Cl.⁵ .......................................... H01L 21/265
[52] U.S. Cl. ........................................ 437/45; 437/27; 437/162; 437/150
[58] Field of Search ................... 437/45, 162, 950, 27, 437/150; 148/DIG. 144

[56] References Cited

U.S. PATENT DOCUMENTS 4,764,478  8/1988  Hiruta .................................. 437/27
5,091,328  2/1992  Miller .................................. 437/150

FOREIGN PATENT DOCUMENTS

0136958  11/1978  Japan .................................. 437/162
0208829  9/1986  Japan .................................. 437/162

*Primary Examiner*—Olik Chaudhuri
*Assistant Examiner*—Tuan Nguyen
*Attorney, Agent, or Firm*—Finnegan, Henderson, Farabow, Garrett and Dunner

[57] ABSTRACT

Formed on the element region of an n-type semiconductor substrate is a silicon oxide layer, on which a polysilicon layer is formed. Boron ions, p-type impurities, are then implanted into the polysilicon layer, from which boron diffuses into the element region via the silicon oxide layer, with the result that a p-channel region of the p-channel MOS transistor is formed.

10 Claims, 6 Drawing Sheets

MAUFACTURING METHOD OF SEMICONDUCTOR DEVICES

BACKGROUND OF THE INVENTION

1. Field of the Invention

This invention relates to a manufacturing method of semiconductor devices, and more particularly to a manufacturing method of MOS transistors or semiconductor integrated circuits containing MOS transistors.

2. Description of the Related Art

MOS transistors using polycrystalline silicon (polysilicon) layers, into which highly concentrated impurities have been introduced, as gate electrodes, are known as silicon-gate MOS transistors. Such silicon-gate MOS transistors, including p-channel MOS transistors on an n-type silicon substrate, are generally fabricated through the processes shown in FIGS. 1A through 1D.

Figure 1A:
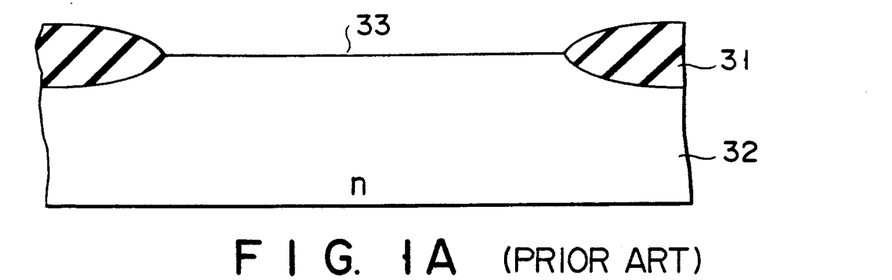
FIGS. 1A through 1D are sectional views each showing the construction of an element in manufacturing conventional p-channel MOS transistors.

First, as shown in FIG. 1A, a field insulating film 31 to separate elements is formed on the surface of an n-type silicon substrate 32 by selective oxidation to separate element regions 33 from each other.

Figure 1B:
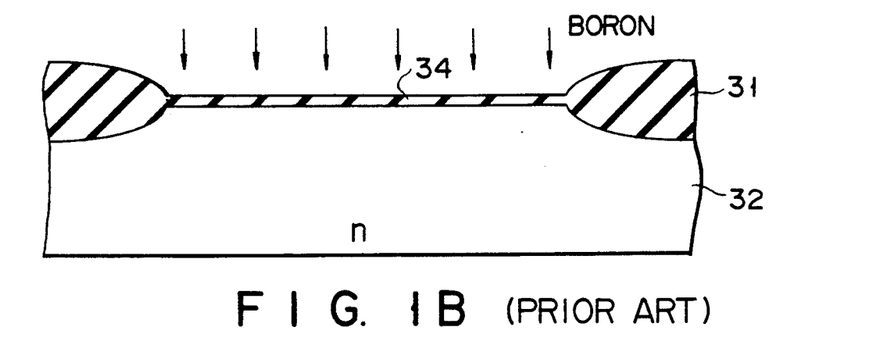

As shown in FIG. 1B, a silicon oxide film 34 is then formed on the element region 33. To control the threshold of the MOS transistor, p-type impurities, such as boron ions, are implanted into the element region 33 through the silicon oxide film 34.

Figure 1C:
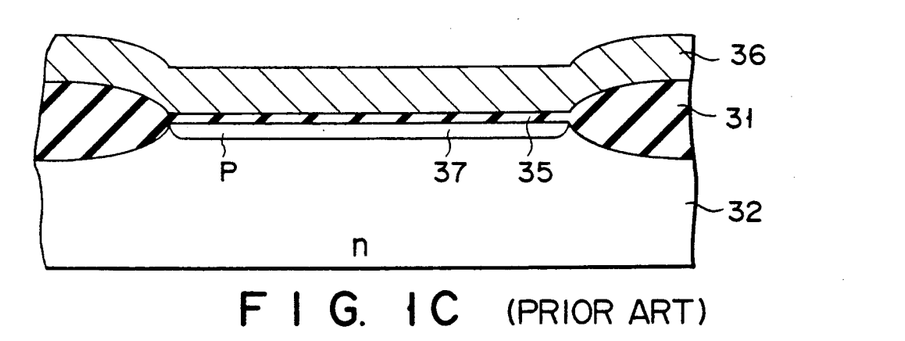

After removal of the silicon oxide film 34, as shown in FIG. 1C, another clean silicon oxide film (a gate oxide film) 35 is formed to a specified thickness. Deposited over the entire surface is a polysilicon layer 36, into which n-type impurities, such as phosphorus, are diffused. The phosphorus-diffused polysilicon layer 36 will be used as gate electrode material in the subsequent step. Heat treatment during the diffusion of phosphorus into the polysilicon layer 36 has activated ions implanted into the element region 33, which forms a p-type region 37.

Figure 1D:
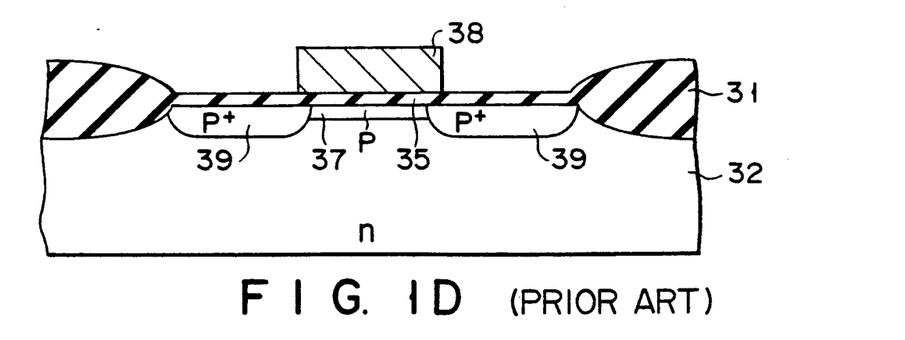

As shown in 1D, the polysilicon layer 36 is then patterned on the desired shape to form the gate electrode 38 of the MOS transistor. After this, p-type impurities, such as boron ions, are implanted into the substrate to form the p-type source and drain regions 39 and 39 at the surface of the element region 33.

The aforementioned manufacturing method is now in widespread use. However, as MOS transistors are getting smaller, manufacturing such fine MOS transistors, particularly p-channel MOS transistors has begun to pose a problem. That is, for p-channel MOS transistors using n-type impurity-added polysilicon gate electrodes 38, in order to set the threshold of the MOS transistor to a practical range of −0.8 V to −0.5 V, p-type boron ions are implanted into the channel portion (the region between the source and drain diffusion regions) as described above, to form a p-type region 37 near the interface of the gate oxide film 35 and silicon substrate 32 as shown in FIG. 1D.

Figure 2:
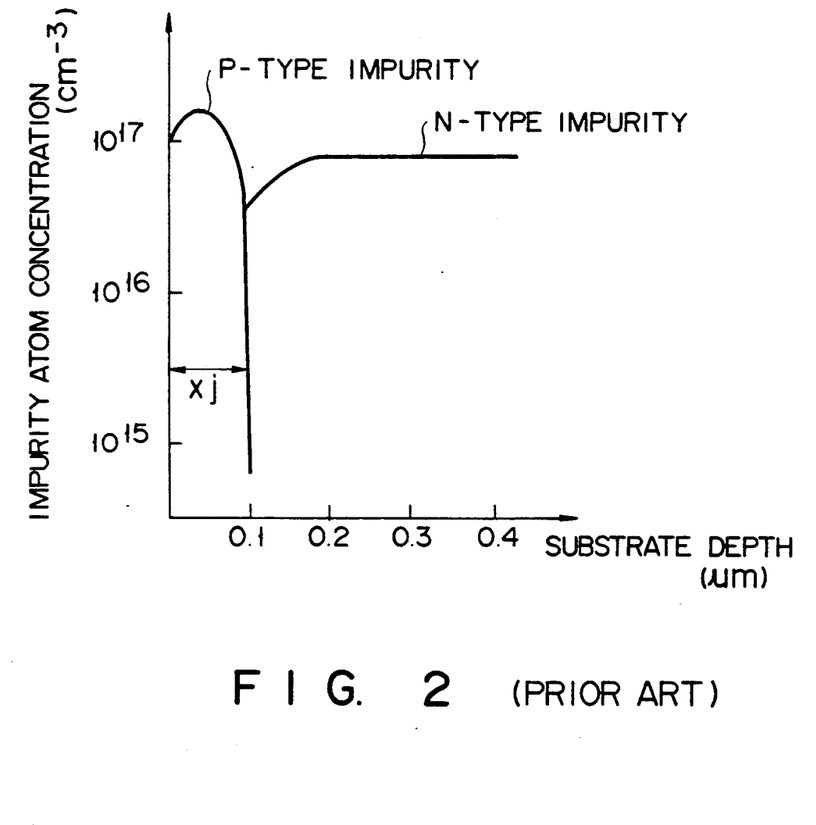
FIG. 2 shows an impurity profile in the substrate depth direction at the channel portion of the MOS transistor in FIG. 1D.

FIG. 2 shows an impurity profile in the substrate depth direction at the channel portion of the p-channel MOS transistor of FIG. 1D.

To control the threshold of the MOS transistor, it is necessary to sufficiently raise the impurity concentration in the p-type region 37 and give a shallow distribution. It is also necessary to place the peak of the impurity distribution in the interface with the gate oxide film, if possible.

In using ion implantation to control the threshold of the MOS transistor as mentioned above, the fabrication of MOS transistors with the implanted ion-exposed silicon oxide film 34 as it is causes many problems.

While smaller MOS transistors require thinner gate oxide films, using silicon oxide films exposed to implanted ions without any treatment cannot assure sufficient withstand voltage and reliability.

To avoid this problem, after the ion implantation in FIG. 1B is complete, the silicon oxide film 34 is removed, and then another clean gate oxide film 35 is formed to a specified thickness.

In this manufacturing method, however, after the ion implantation of boron to control the threshold of MOS transistor, the gate oxide film 35 is formed. As a result, boron atoms near the surface of the substrate are absorbed into the gate oxide film 35, reducing the boron concentration near the substrate's surface. This makes it difficult to place the peak of the impurity distribution in the interface with the gate oxide film.

The above phenomenon deepens the diffusion depth $x_j$ of the p-type impurity region in FIG. 2, so that the fabrication of fine p-channel MOS transistors becomes extremely difficult.

SUMMARY OF THE INVENTION

Accordingly, an object of the present invention is to provide a manufacturing method of semiconductor devices that allows control of the threshold of MOS transistors without ion implantation through the gate oxide layer.

Another object of the present invention is to provide a manufacturing method of semiconductor devices that makes it unnecessary to re-form the gate oxide layer after the control of the MOS transistor's threshold because of the gate oxide layer not being subjected to ion implantation, and facilitates the placement of the impurity distribution peak in the substrate depth direction in the interface with the gate oxide film.

Still another object of the present invention is to provide a manufacturing method of semiconductor devices that facilitates the formation of fine MOS transistors.

According to the present invention, there is provided a manufacturing of semiconductor devices, comprising a first step of forming a first gate oxide layer on an element region of a semiconductor substrate of a first conductivity type; a second step of forming a first polysilicon layer on the first gate oxide layer; a third step of introducing into the first polysilicon layer impurities of a second conductivity type opposite in polarity to the first conductivity type; and a fourth step of diffusing impurities of the second conductivity type from the first polysilicon layer, into which the second conductivity-type impurities have been introduced, to the element region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention.

DETAILED DESCRIPTION OF THE PREFERRED EMBODIMENTS

Referring to the accompanying drawings, a first embodiment of the present invention will be explained.

FIGS. 3A through 3E illustrate the processes for manufacturing p-channel MOS transistors on an n-type silicon substrate according to a first embodiment of the present invention.

Figure 3A:
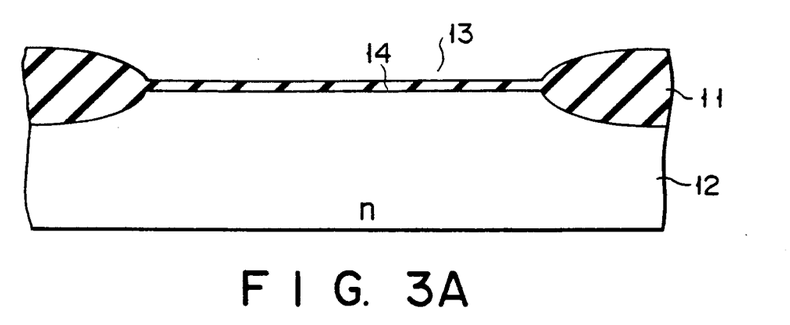
FIGS. 3A through 3E are sectional views each showing the construction of an element in manufacturing p-channel MOS transistors according to a first embodiment of the present invention.

First, a field insulating film 11 to separate elements is formed on the surface of an n-type silicon substrate 12 by selective oxidation as shown in FIG. 3A. As a result, the element region 13 is separated from the other element regions.

Then, on the element region 13, a silicon oxide film (gate oxide layer) 14 of for example, as thin as 10 nm or less is formed by thermal oxidation. This step and the preceding steps are the same as those described in FIG. 1.

Figure 3B:
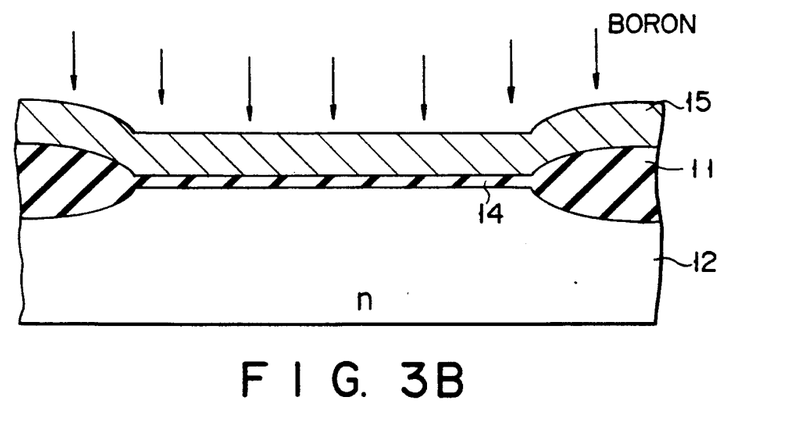

As shown in 3B, over the entire surface of the substrate, a polysilicon layer 15 is then deposited to a thickness of nearly 400 nm. Into the polysilicon layer 15, p-type impurities, such as boron ions, are implanted at an accelerating voltage of 40 KeV at a dose of $5 \times 10^{15} cm^{-2}$.

Figure 3C:
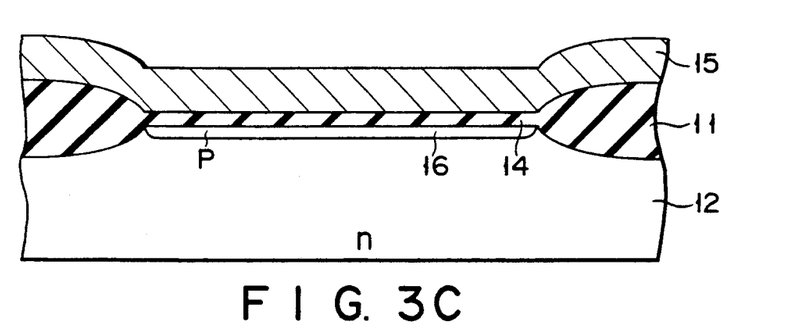

After this, to control the threshold of the MOS transistor, the polysilicon layer 15 undergoes heat treatment for 30 minutes at 900° C. in an atmosphere of nitrogen containing 10% hydrogen, causing boron atoms to diffuse from the polysilicon layer 15 to the surface of the substrate, with the result that a p-type region 16 is formed as shown in FIG. 3C.

The advantage of the addition of hydrogen to an atmosphere of gas is that when heat treatment is performed at 900° C. as noted above, in an atmosphere of nitrogen containing hydrogen, the diffusion speed of boron in the silicon oxide layer 14 is nearly one thousand times as fast as that in an atmosphere of nitrogen only, but the diffusion speed in the silicon substrate 12 does not increase so much. By making use of this characteristics, it is possible to form a shallow p-type region 16 in the silicon substrate 12. That is, boron atoms in the boron-added polysilicon layer 15 are efficiently transferred via the silicon oxide layer 14 to the silicon substrate 12 without increasing the heat treatment temperature or lengthening the diffusion time, which raises the boron concentration in the surface of the substrate. As a result of this, the p-type region 16 formed at the silicon substrate's surface has a shallow diffusion depth and a high concentration. The same result may be obtained by performing heat treatment in a atmosphere of nitrogen containing water instead of hydrogen when boron is diffused from the polysilicon layer 15 to the surface of the silicon substrate 12.

Immediately after this process is complete, the polysilicon layer 15 is of the p-type because of implanted boron ions.

Figure 3D:
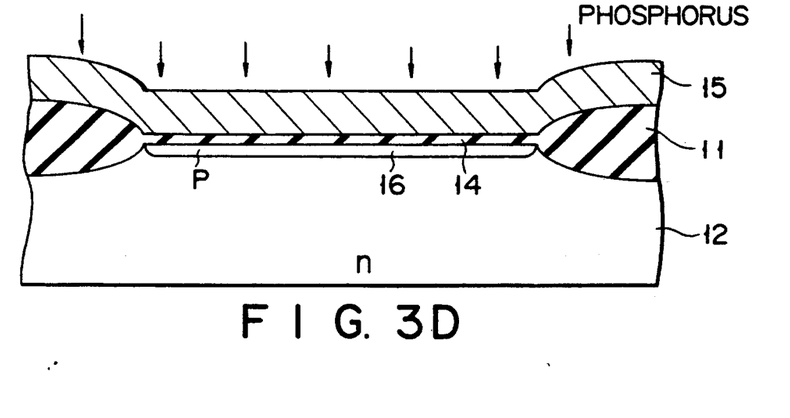

Next, as shown in FIG. 3D, by performing thermal diffusion for 60 minutes at 900° C. in an atmosphere of n-type impurities such as phosphorus, the polysilicon layer 15 is changed into an n-type conductivity layer to form gate electrode material. In this case, phosphorus diffuses much slower in the silicon oxide layer 14 than boron, so that phosphorus hardly diffuses into the substrate.

Figure 3E:
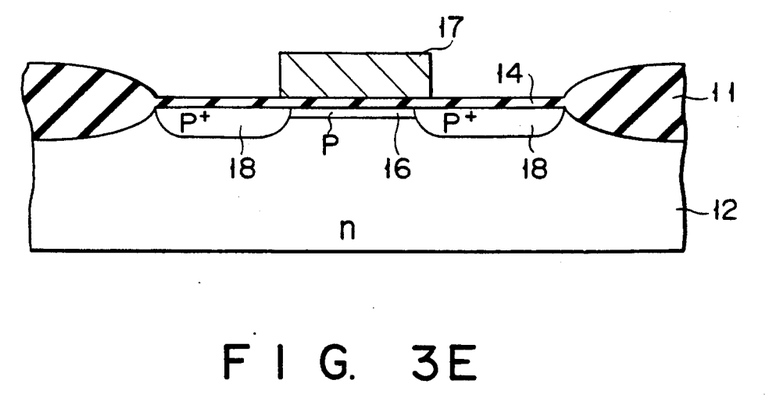

As shown in FIG. 3E, after the gate electrode material (n-type polysilicon layer 15) is patterned on the desired shape to form the gate electrode 17 of the MOS transistor, by using the gate electrode 17 and field insulating film 11 as a mask, p-type impurities, such as boron ions, are implanted into the substrate at a accelerating voltage of 35 KeV at a dose of $1 \times 10^{15} cm^{-2}$ to form the $p^+$-type source and drain diffusion regions 18 and 18. At the same time, boron is also implanted into the n-type gate electrode 17. In spite of boron ion implantation, the n-type conductivity of the gate electrode 17 is ensured because the aforementioned phosphorus diffusion has raised the n-type impurity concentration sufficiently in the polysilicon layer.

Figure 4:
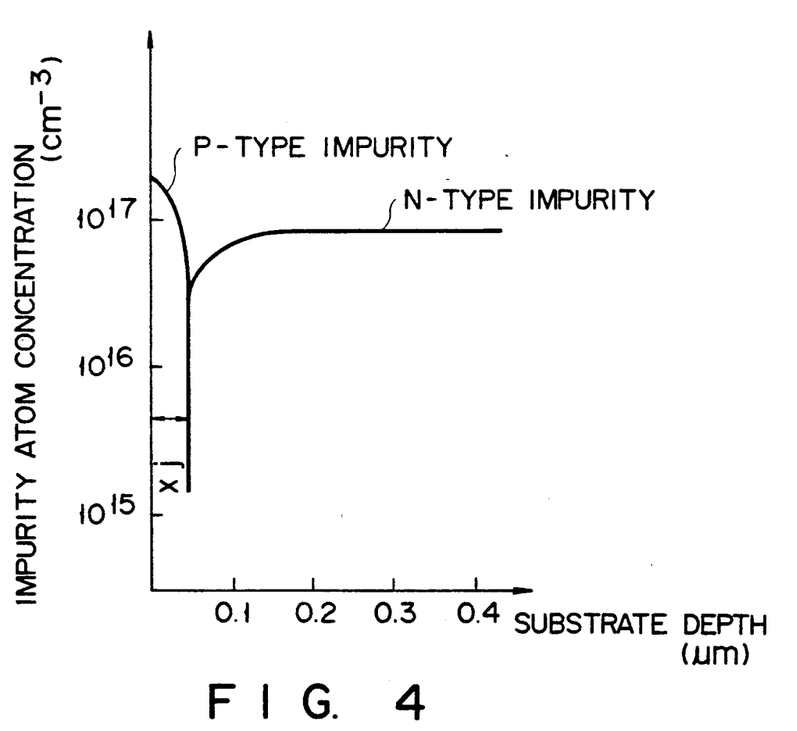
FIG. 4 shows an impurity profile in the substrate depth direction at the channel portion of the MOS transistor in FIG. 3E.

FIG. 4 shows an impurity profile in the substrate depth direction at the channel portion of the p-channel MOS transistor thus produced in FIG. 3E.

With a manufacturing method according to the above embodiment, the p-type region 16 is formed by diffusion through the gate oxide film 14, which allows the threshold of the MOS transistor to be controlled without ion implantation through the gate oxide film 14. This prevents the gate oxide layer 14 from being exposed to ions, thereby avoiding damage due to ions. As a result, there is no need to re-form a gate oxide layer after the control of the MOS transistor's threshold, which facilitates the placement of the peak of the impurity distribution in the substrate depth direction at the MOS transistor's channel portion in the interface with the gate oxide layer. In connection with this, the diffusion depth xj of the p-type region 16 could be maintained as small as nearly 0.05 μm.

Compared with conventional p-channel MOS transistors subjected to the same thermal process, fine MOS transistors were easy to form in this embodiment, and showed improvements of as much as nearly 0.15 μm in the reduced threshold due to shorter gate length, or what is called short channel effects.

In this manufacturing method, it is possible to control the impurity concentration at the surface of channel portion with a high accuracy, since all factors are easy to control. They include: the film thickness of the gate oxide layer 14, the dose of boron ions implanted into the polysilicon layer 15, and the boron diffusion from the polysilicon layer 15 to the substrate 12.

When boron was diffused from the polysilicon layer 15 via the 10-nm-thick gate oxide layer 14 to the substrate's surface by implanting boron ions into the polysilicon layer 15 for 30 minutes at 900° C. at a dose of $1 \times 10^{15}$ to $5 \times 10^{15} cm^{-2}$ in an atmosphere of nitrogen containing hydrogen, the impurity concentration at the substrate's surface was controlled to $5 \times 10^{16}$ to $1 \times 10^{18}$ cm$^{-3}$. At the same time, the diffusion depth ranged from 0.03 to 0.08 μm, a half or a third the diffusion depth of the prior art.

A second embodiment of the present invention will be explained.

In the first embodiment, after the p-type region 16 is formed as shown in FIG. 3C, the gate oxide layer 14 is used as it is.

However, because of the existence of impurities used to form the p-type region 16, using the gate oxide layer 14 without any treatment can have an adverse effect on the characteristics of the transistor.

In the second embodiment, the adverse effect due to the remaining impurities in the gate oxide film 14 will be eliminated.

Figure 5A:
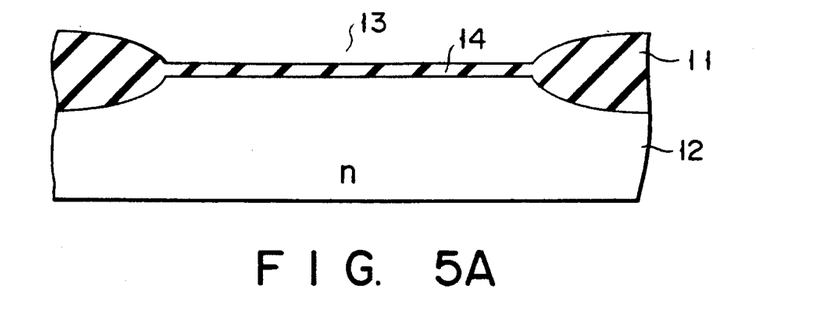
FIGS. 5A through 5E are sectional views each showing the construction of a element in manufacturing p-channel MOS transistors according to a second embodiment of the present invention.
Figure 5B:
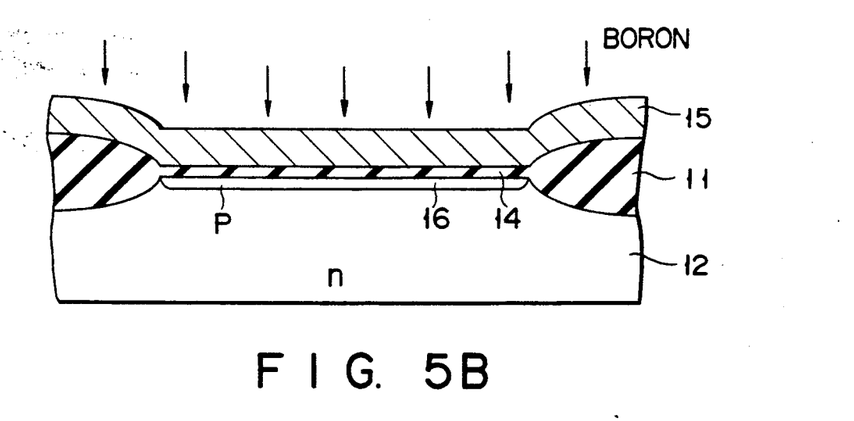

As shown FIGS. 5A and 5B, the field insulating film 11, the silicon oxide film (gate oxide layer) 14, and the polysilicon layer 15 are formed in this order. Boron ions are implanted into the polysilicon film 15 and then diffused from the polysilicon film 15 to the surface of the substrate to form the p-type region 16. All these steps are the same as those in the first embodiment.

Figure 5C:
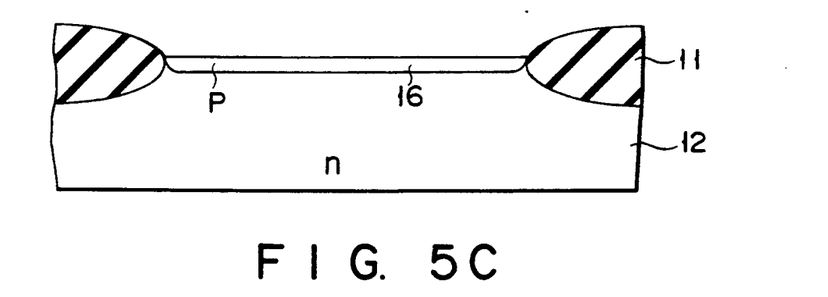

As shown in FIG. 5C, in this embodiment, the polysilicon layer 15 and silicon oxide film 14, which have been used to form the p-type region 16, are removed in sequence to expose the surface of the element region 14. Removal of the polysilicon layer 15 is achieved by, for example, wet etching, whereas removal of the silicon oxide film 14 is accomplished by, for example, plasma etching known as CDE (Chemical Dry Etching).

Figure 5D:
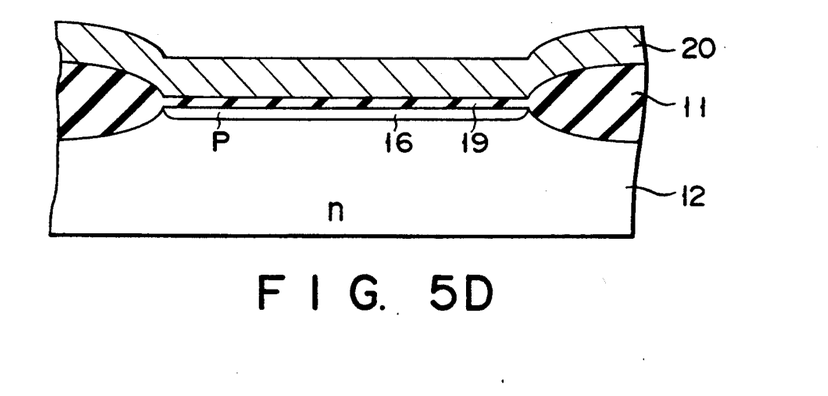

Then, as shown in FIG. 5D, a clean silicon oxide film (gate oxide film) 19 is formed on the substrate's surface by, for example, thermal oxidation. After this, over the entire surface of the substrate, a polysilicon layer 20 is deposited to a thickness of nearly 400 nm by CVD (Chemical Vapor Deposition). To the polysilicon film 20, n-type impurities, such as phosphorus, are diffused to form gate electrode material.

Figure 5E:
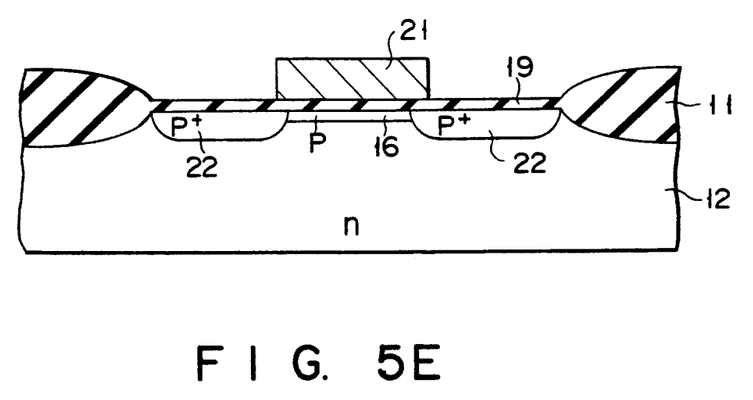

Next, as shown in FIG. 5E, the polysilicon layer 20 is patterned on the desired shape to form the gate electrode 21 of the MOS transistor. After this, using the gate electrode 21 and field insulating film 11 as a mask, p-type impurities, such as boron ions, are implanted at an accelerating voltage of 35 KeV at a dose of $1 \times 10^{15}$ cm$^{-2}$ to form the p$^+$-type source and drain diffusion regions 22 and 22 at the substrate's surface.

Although in the first and second embodiments, the present invention is applied to a manufacturing method for discrete devices, it may be applicable to a manufacturing method of MOS (insulated gate) semiconductor integrated circuits, bipolar MOS semiconductor integrated circuits, or semiconductor integrated circuits composed of CCDs (Charge-Coupled Devices) or EPROMs (Electrically Programmable ROMs).

As described above, with a semiconductor manufacturing method according to the present invention, it is possible to control the threshold of the MOS transistor without ion implantation through the gate oxide layer. Because the gate oxide layer is not subjected to ion implantation and the gate oxide film is not required to be re-formed after the control of the MOS transistor's threshold, it is easy to place the peak of the impurity distribution in the substrate depth direction at the channel portion in the interface with the gate oxide film. This facilitates the formation of fine MOS transistors.

This invention is not restricted to the first and second embodiments, and may be practiced or embodied in still other ways without departing from the spirit or essential character thereof. For instance, while in the above embodiments, boron ions are implanted into the polysilicon layer 15 to form the p-type region 16, boron bifluoride (BF$_2$) ions may be implanted instead of boron ions. Either boron ions or boron bifluoride ions are implanted, the voltage for accelerating the ions is set in accordance with the thickness of the polysilicon layer 15, in order to prevent the implanted ions from penetrating the polysilicon layer 15 and reaching the underlying silicon oxide layer 14. More specifically, the voltage is set at 40 KeV or the less when the layer 15 is 400 nm thick as in the first and second embodiments.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing semiconductor devices, comprising:
    a first step of forming a first gate oxide layer on an element region of a semiconductor substrate of a first conductivity type;
    a second step of forming a first polysilicon layer on said first gate oxide layer;
    a third step of introducing into said first polysilicon layer impurities of a second conductivity type opposite in polarity to the first conductivity type;
    a fourth step of diffusing impurities of the second conductivity type from said first polysilicon layer, into which said second conductivity-type impurities have been introduced, to said element region, said fourth step being effected by heat treatment; and
    a fifth step of changing the conductivity type of said first polysilicon layer by diffusing impurities of the first conductivity type into said first polysilicon layer, to which said second conductivity-type impurities have been introduced.

2. A method for manufacturing semiconductor devices according to claim 1, wherein said third step is effected by ion implantation.

3. A method for manufacturing semiconductor devices according to claim 1, wherein said fourth step is effected by said diffusing being performed by heat treatment in an atmosphere of a gas containing hydrogen or water.

4. A method for manufacturing semiconductor devices according to claim 1, wherein said third step is effected by ion implantation of boron.

5. A method for manufacturing semiconductor devices according to claim 4, wherein said ion implantation is performed at an ion accelerating voltage of 40 KeV or below.

6. A method for manufacturing semiconductor devices according to claim 1, further comprising, after the fifth step, a sixth step of patterning said first polysilicon layer to a desired shape.

7. A method for manufacturing semiconductor devices according to claim 6, further comprising a seventh step of forming source and drain regions by introducing impurities of the second conductivity type into said substrate with said desired-shaped first polysilicon layer serving as a mask.

8. A method for manufacturing semiconductor devices, comprising:
- a first step of forming gate oxide layer on an element region of a semiconductor substrate of a first conductivity type;
- a second step of forming a first polysilicon layer on said first gate oxide layer;
- a third step of introducing into said first polysilicon layer impurities of a second conductivity type opposite in polarity to the first conductivity type;
- a fourth step of diffusing impurities of the second conductivity type from said first polysilicon layer, into which said second conductivity-type impurities have been introduced, to said element region, said fourth step being achieved by heat treatment in an atmosphere of gas containing hydrogen or water;
- a fifth step of removing said first polysilicon layer and said first oxide layer in sequence;
- a sixth step of forming a second gate oxide layer on said element region;
- a seventh step of forming a second polysilicon layer on at least said gate oxide layer; and
- an eighth step of adding to said second polysilicon layer impurities of a second conductivity type opposite in polarity to said first conductivity type.

9. A method for manufacturing semiconductor devices according to claim 8, further comprising, after the eighth step, a ninth step of patterning said second polysilicon layer to a desired shape.

10. A method for manufacturing semiconductor devices according to claim 9, further comprising a tenth step of forming source and drain regions by introducing impurities of the second conductivity type into said substrate with said desired-shaped second polysilicon layer serving as a mask.

* * * * *